United States Patent [19]

Kuo

[11] Patent Number: 5,315,623
[45] Date of Patent: May 24, 1994

[54] DUAL MODE PHASE-LOCKED LOOP

[75] Inventor: Yao H. Kuo, Brentwood, England

[73] Assignee: Ford Motor Company, Dearborn, Mich.

[21] Appl. No.: 924,808

[22] Filed: Aug. 4, 1992

[51] Int. Cl.⁵ .................................... H04L 7/06
[52] U.S. Cl. ........................... 375/120; 331/1 A
[58] Field of Search ............... 375/81, 120; 331/1 R, 331/17, 25, 36 R, 32, 1 A

[56] References Cited

U.S. PATENT DOCUMENTS

| | | | |
|---|---|---|---|
| 3,719,896 | 3/1973 | Holistein, Jr. et al. | 331/14 |
| 3,921,094 | 11/1975 | Schaible | 331/1 A |
| 4,280,104 | 7/1981 | Rzeszewski | 331/1 A |
| 4,426,734 | 1/1984 | Tults et al. | 455/180 |
| 4,498,191 | 2/1985 | Rogers | 455/164 |
| 4,525,686 | 6/1985 | Yokoya | 331/17 |
| 4,534,044 | 8/1985 | Funke et al. | 375/120 |
| 4,546,330 | 10/1985 | Okada | 331/17 |
| 4,745,372 | 5/1988 | Miwa | 331/8 |
| 4,800,342 | 1/1989 | Jackson | 331/10 |
| 4,940,951 | 7/1990 | Sakamoto | 375/81 |
| 4,970,474 | 11/1990 | Kennedy et al. | 331/2 |
| 4,987,387 | 1/1991 | Kennedy et al. | 331/1 A |
| 5,111,124 | 5/1992 | Kurosawa | 318/434 |
| 5,113,152 | 5/1992 | Norimatsu | 331/11 |
| 5,126,693 | 6/1992 | Gulliver et al. | 331/14 |

FOREIGN PATENT DOCUMENTS 0371790 6/1990 European Pat. Off. .

OTHER PUBLICATIONS

Badger, "Pole-Zero Cancellation Reduces Noise in Phase-Locked Loop Systems", Proc. RF Tech. Expo, Feb. 10, 1988, pp. 157–162.
Horowitz et al., The Art of Electronics, 1980, Cambridge University Press, pp. 428–437.

Primary Examiner—Stephen Chin
Assistant Examiner—Young Tse
Attorney, Agent, or Firm—Mark Mollon; Roger L. May

[57] ABSTRACT

A phase-locked loop is provided for operating in either a steady-state mode or a transient mode. The steady-state mode obtains high rejection of noise disturbances to maintain lock of the phase-locked loop. The transient mode provides a near deadbeat response in order to quickly acquire a new phase-locked loop frequency when a new frequency command is received.

6 Claims, 4 Drawing Sheets

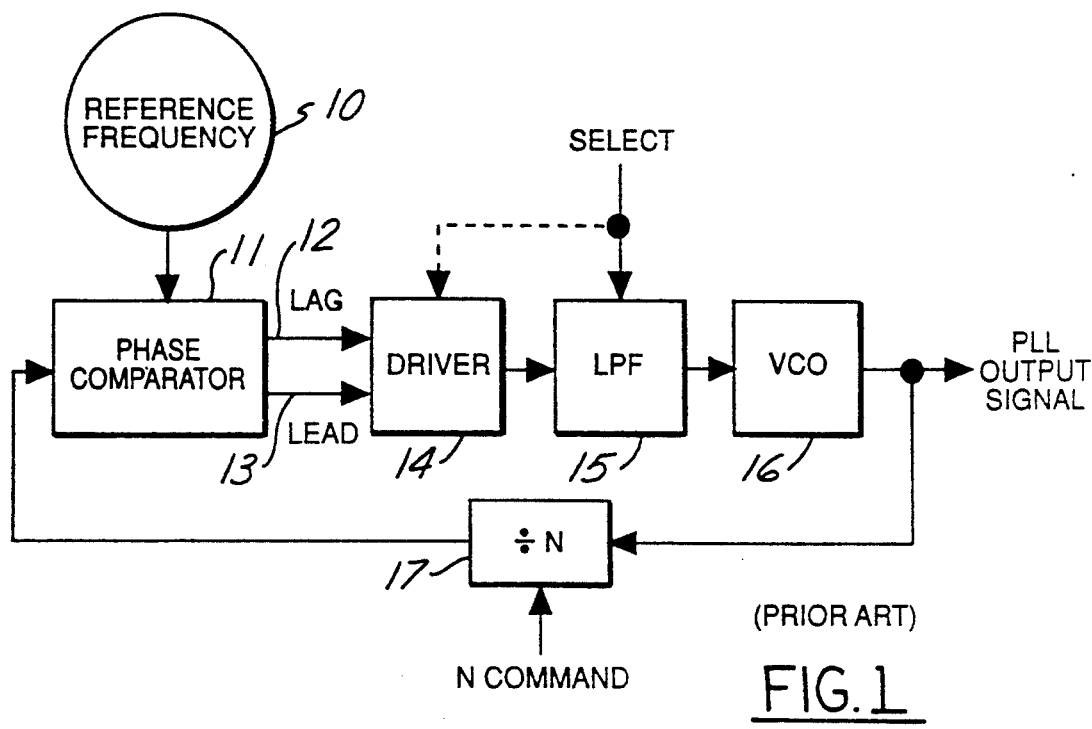
(PRIOR ART) FIG.1
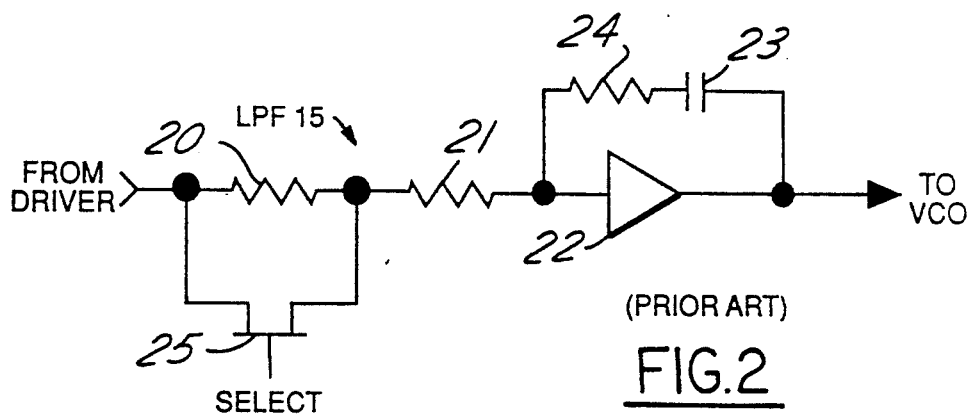
(PRIOR ART) FIG.2
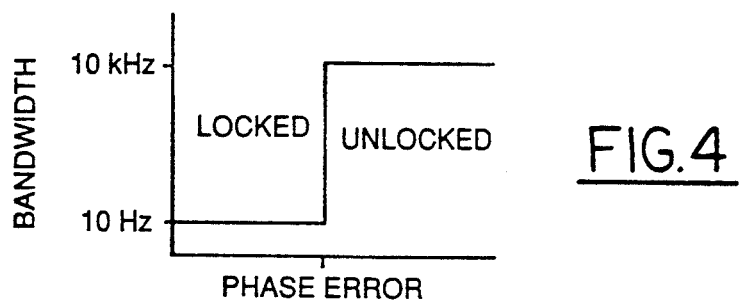
FIG.4

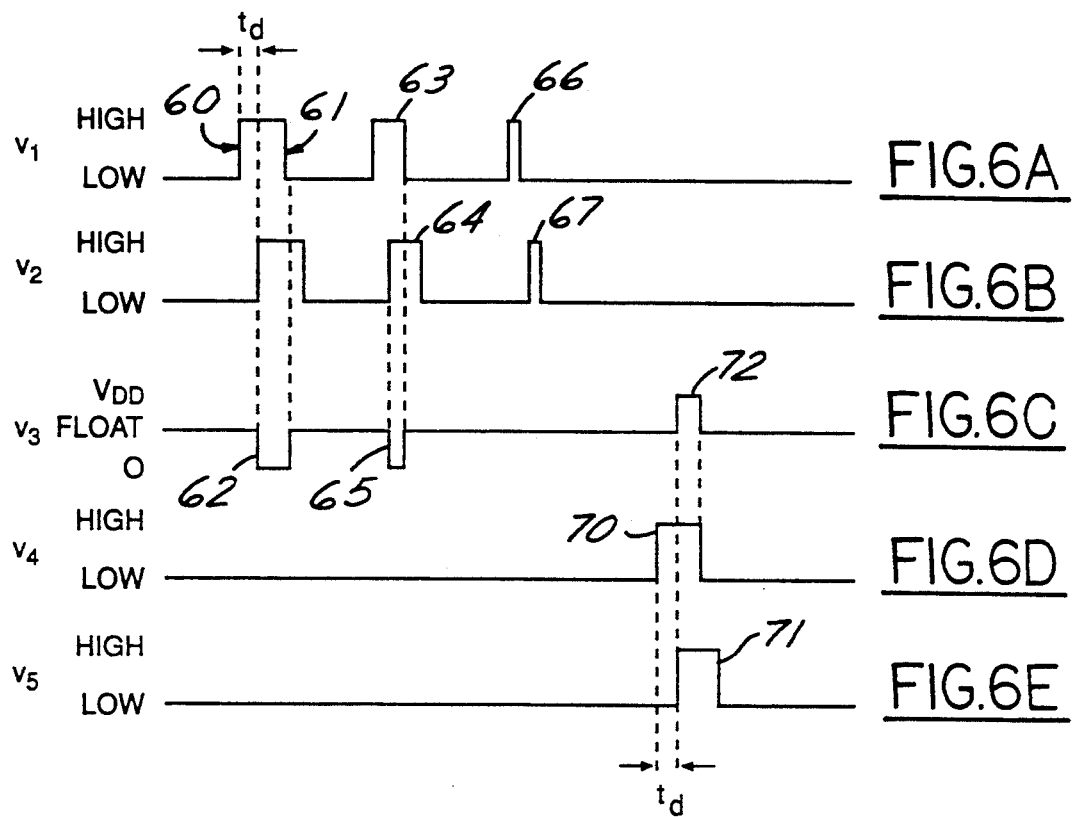
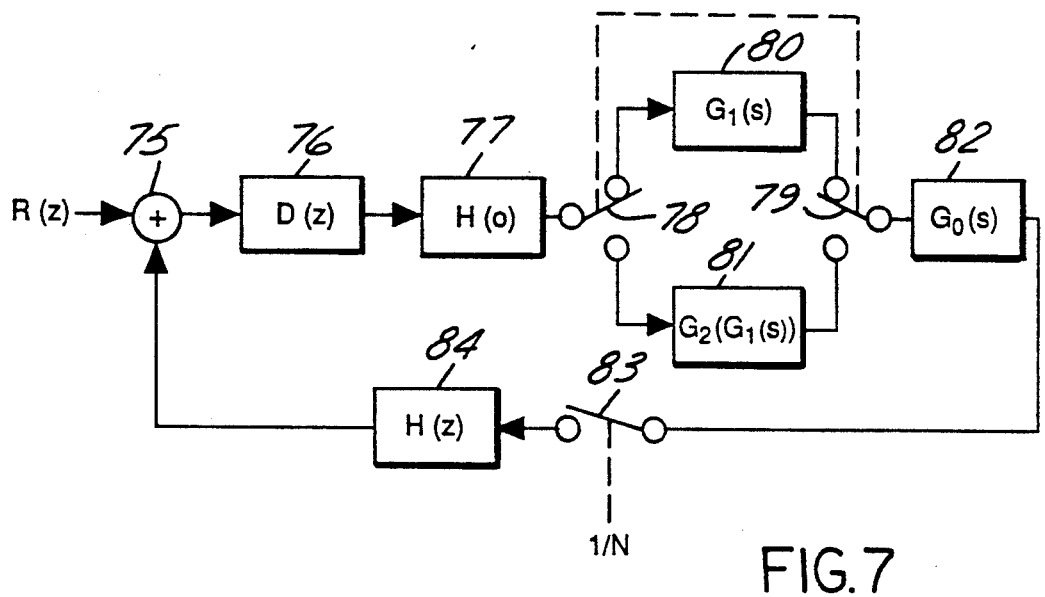

DUAL MODE PHASE-LOCKED LOOP

BACKGROUND OF THE INVENTION

The present invention relates in general to phase-locked loops and more specifically to a phase-locked loop providing a first response during a steady-state or locked operating condition and a second response during a transient or unlocked operating condition.

The phase-locked loop (PLL) is widely used as a frequency synthesizer in radio receivers. In particular, a PLL is employed to generate a mixing signal having a commanded frequency for shifting a desired radio frequency (RF) signal to a fixed intermediate frequency (IF) signal. A variable frequency divider is employed connected between the voltage-controlled oscillator (VCO) and the PLL phase detector so that any of a number of predetermined frequencies can be selected.

For each particular value of the frequency divider, the phase-locked loop "locks-in" to maintain a fixed phase relationship between the divided VCO output signal and a reference signal. When the frequency divider is changed to a new value, the control voltage to the VCO is altered until the PLL locks at the new output frequency.

When a PLL is locked, it is desirable to reject any disturbances (other than a change in the frequency divider command) such as noise in the phase detector or the loop filter which might alter the PLL output. A loop filter with a narrow bandpass (i.e., a long time constant) is known to provide the best disturbance rejection for the PLL.

When switching to a new synthesized frequency, it is desirable to quickly lock-in at the new frequency. Fast frequency shifting is important in scan tuning operations and in radios which sample received signal strength at frequencies other than the currently received signal for comparison and selection of the best signal (e.g., as in the radio data system or RDS). It is known that the fastest frequency switching is obtained by providing a wide bandwidth (i.e., short time constant) in the loop filter. Therefore, a tradeoff has been required in designing PLL systems in order to maximize noise immunity when locked (i.e., at steady-state mode) and to minimize the response time in locking into a new frequency (i.e., at transient mode).

Some improvement in PLL characteristics has been obtained in the prior art by providing a selectable time constant for the loop filter, e.g., by using switched resistance in the filter. Specifically, the time constant is reduced (i.e., loop filter bandwidth is increased) when a variable frequency divider command is changed in order to quickly lock-on and synthesize a new output frequency. Once the new frequency is reached, the time constant is increased (i.e., loop filter bandwidth is reduced) so that frequency lock is maintained during noise disturbances or flutter in the PLL inputs. These techniques are employed, for example, in Norimatsu U.S. Pat. No. 5,113,152 and Okada U.S. Pat. No. 4,546,330.

The upper and lower time constants (i.e., the two selectable values for the upper cutoff frequency of the loop filter) that can be used in the prior art are constrained by the requirement that the feedback system be stable throughout the operating range of the PLL. In the prior art, it has not been possible to simultaneously obtain high disturbance rejection at steady-state mode and very fast (i.e., near deadbeat) frequency switching during transient mode.

SUMMARY OF THE INVENTION

Accordingly, it is an object of the present invention to provide a near deadbeat transient response in a phase-locked loop system simultaneously having maximum disturbance rejection during steady-state mode.

The phase-locked loop of the invention employs a phase comparator responsive to the PLL output signal and a reference signal for generating a lead signal or a lag signal indicating the phase relationship therebetween. A lowpass filter includes a lag circuit and a lead circuit. The lag circuit provides the lowpass filter with a relatively low cutoff frequency and the lead circuit provides a relatively high cutoff frequency. A driver means is coupled to the phase comparator and the lowpass filter for charging the lag circuit in response to the lag signal and for discharging the lag circuit in response to the lead signal. The driver means further senses a transient condition of the phase-locked loop and if a transient condition is sensed then charges the lead circuit in response to the lead signal and discharges the lead circuit in response to the lag signal.

BRIEF DESCRIPTION OF THE DRAWINGS

The novel features of the invention are set forth with particularity in the appended claims. The invention itself, however, both as to its organization and method of operation, together with further objects and advantages thereof, may best be understood by reference to the following description taken in conjunction with the accompanying drawings in which:

FIG. 1 is a block diagram showing a phase-locked loop according to the prior art.

FIG. 2 is a schematic diagram showing a loop filter having a selectable time constant as employed in the prior art.

FIG. 4 illustrates the relationship between phase error and loop filter bandwidth as employed in the present invention.

FIGS. 6A-6E are waveform diagrams illustrating voltage signals at various points in FIG. 5.

FIG. 7 is a block diagram showing transfer functions associated with the preferred embodiment of the invention.

DETAILED DESCRIPTION OF PREFERRED EMBODIMENTS

Figure 5:
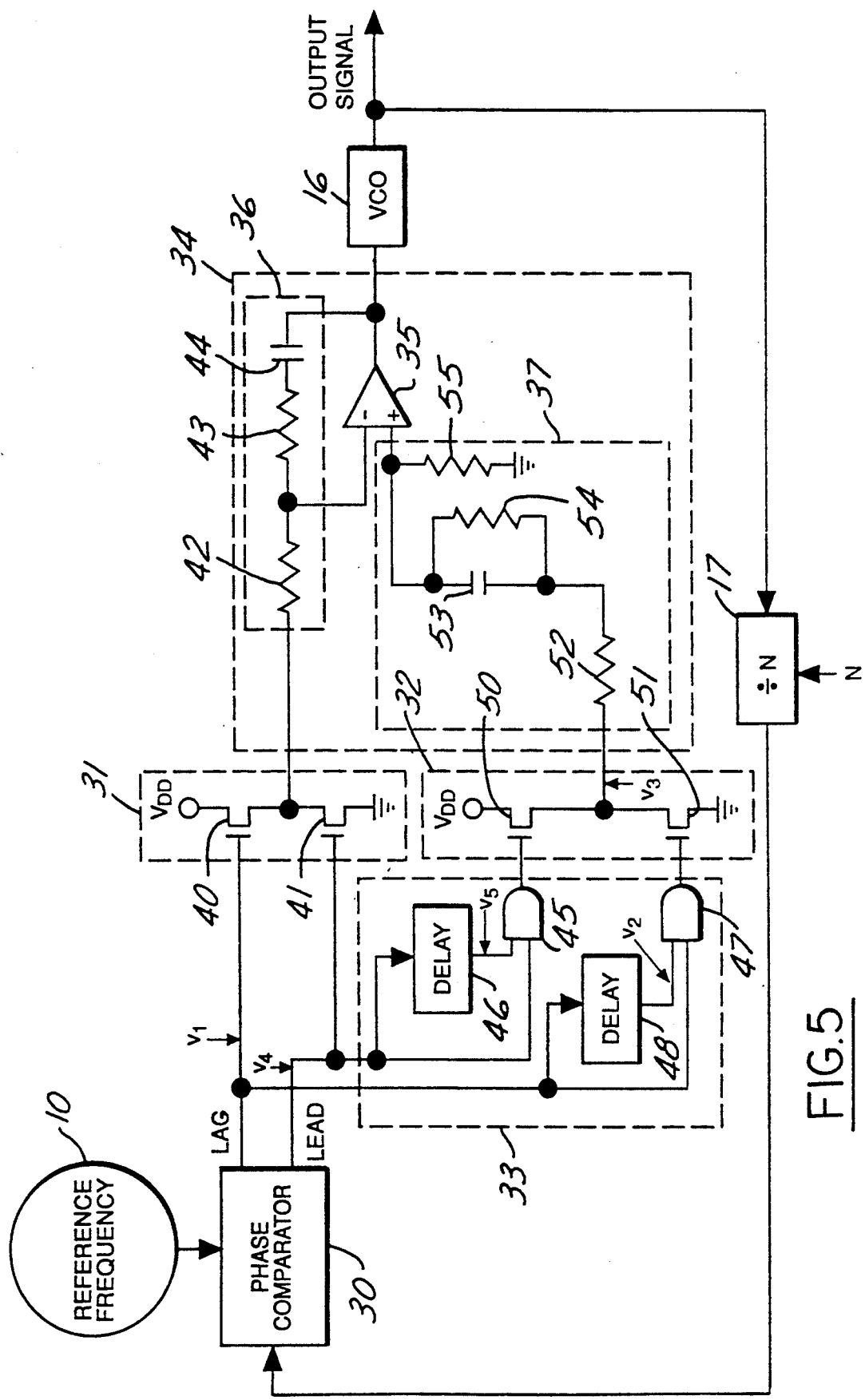
FIG. 5 is a schematic diagram showing the embodiment of FIG. 3 in greater detail.

Referring to FIG. 1, a prior art phase-locked loop includes a reference frequency generator 10 providing a reference frequency to one input of a phase comparator 11. A lag output 12 and a lead output 13 from phase comparator 11 are connected to a driver circuit 14, sometimes referred to in the prior art as a charge pump. The output of driver 14 is connected to a loop filter comprised of a lowpass filter (LPF) 15. A SELECT signal is provided to LPF 15 and/or driver 14 for selecting a long or short time constant as described below. The output of LPF 15 is connected to a voltage-controlled oscillator (VCO) 16 which provides the PLL output signal.

The PLL output signal is further connected to the input of a variable divider 17 which divides the frequency of the PLL output signal by a factor N as determined by an N command signal from a radio tuner control (not shown). The divided output signal from divider 17 is provided to the second input of phase comparator 11.

Phase comparator 11 is shown as a type-II phase detector, the output of which depends on the relative timing between signal edges of the reference signal and the divider output signal. If the divider output signal has an edge occurring before the corresponding edge of the reference signal, phase comparator 11 outputs a lead signal having a duration proportional to (typically equal to) the time difference between the edges. Correspondingly, if the divider output signal edge occurs after the corresponding reference signal edge, phase detector 11 outputs a lag signal having a duration proportional to (equal to) the time difference.

In response to the lag signal on output 12, driver 14 supplies current to charge LPF 15 thereby increasing the frequency of VCO 16 and restoring the proper phase relationship. In response to the lead signal on output 13, driver 14 sinks current from LPF 15 to discharge LPF 15 and reduce the output frequency produced by VCO 16.

The SELECT signal provided to LPF 15 and/or driver 14 is used to select between long or short time constants depending on the desired response for the phase-locked loop. For example, a short time constant is selected during a time where the PLL output is changing from one frequency to another. A long time constant is selected while the PLL is locked to the desired frequency.

As shown in FIG. 2, a prior art LPF 15 includes a resistor 20 having one end connected to driver 14 and the other end connected to one end of a resistor 21. The other end of resistor 21 is connected to the input of an amplifier 22. A capacitor 23 and a resistor 24 are connected in series between the input and the output of amplifier 22. The output of amplifier 22 is connected to the input of VCO 16.

A field-effect transistor (FET) switch 25, such as a junction FET (JFET) or a metal-oxide semiconductor FET (MOSFET), has its output connected across resistor 20 and receives the SELECT signal at its gate input terminal. When FET 25 is non-conductive, the time constant of LPF 15 depends on the resistance of resistors 20, 21, and 24, and the capacitance of capacitor 23. When the SELECT signal renders FET 25 conductive, a shorter time constant is obtained since the resistance from resistor 20 is cancelled. Although changing the time constant of the lowpass filter as employed in the prior art obtains fast or slow PLL response times as desired, the effect is limited since the addition or subtraction of resistance in the lowpass filter beyond certain limits results in instability of the phase-locked loop.

Figure 3:
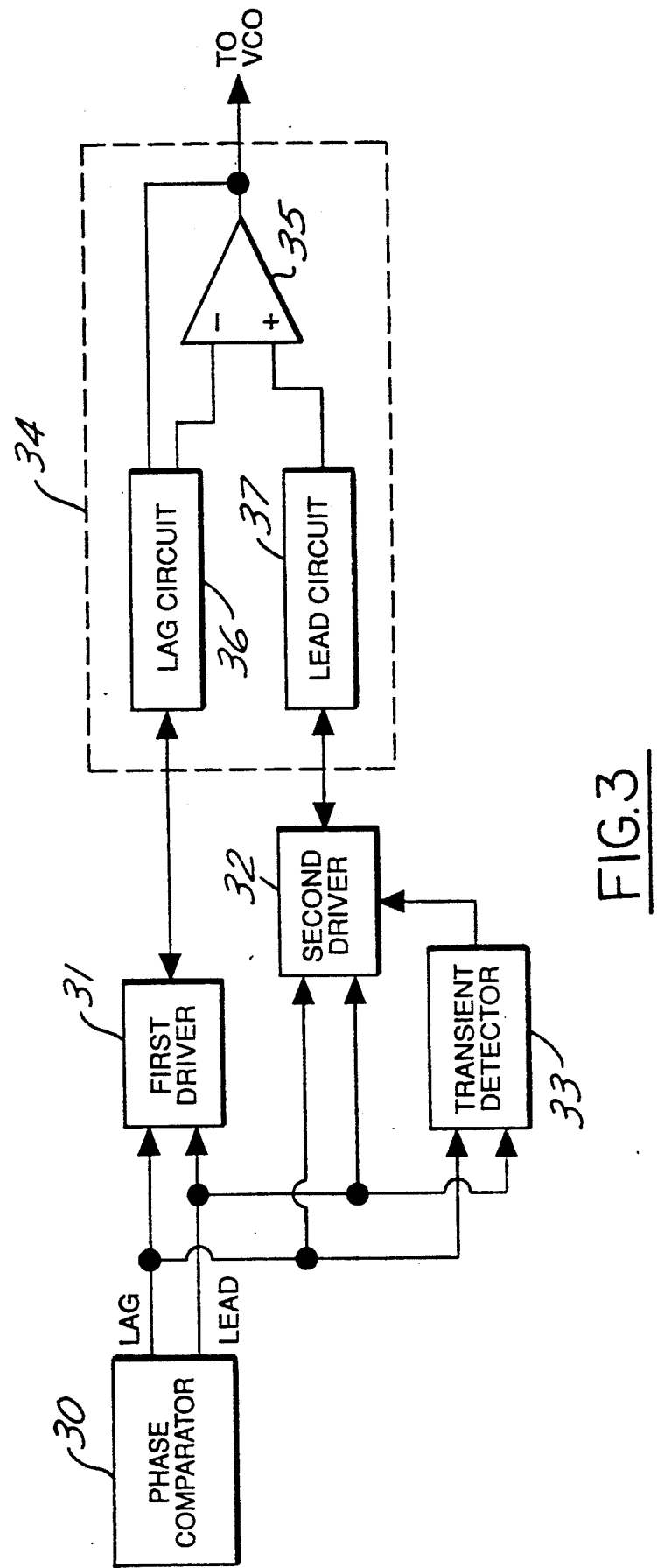
FIG. 3 is a block diagram showing a preferred embodiment of the PLL of the present invention.

The present invention for maximizing disturbance rejection at steady state and for achieving near deadbeat response in a transient state is shown in FIG. 3. A phase comparator 30 provides lag and lead signals to a first driver 31 and to a second driver 32. The lead and lag signals are further connected to a transient detector 33. A lowpass filter 34 is an active filter including an operational amplifier (op amp) 35. A lag circuit 36 is connected to the inverting input and the output of op amp 35 and to first driver 31. A lead circuit 37 is connected to the noninverting input of op amp 35 and second driver 32. The output of op amp 35 provides the output of LPF 34 and is connected to the VCO.

Phase detector 30 and first driver 31 operate to charge lag circuit 36 in response to the lag signal and to discharge lag circuit 36 in response to the lead signal.

Since the duration of each lag signal and each lead signal is proportional to the phase error from the reference frequency, transient detector 33 is able to detect the transient mode whenever the duration of either the lag signal or the lead signal is greater than a predetermined duration. Second driver 32 is activated whenever a transient mode is detected by transient detector 33 and operates to charge lead circuit 37 in response to the lead signal and to discharge lead circuit 37 in response to the lag signal.

Since only lag circuit 36 is active during the steady-state mode, the characteristics of lag circuit 36 are designed to provide the best disturbance rejection at steady-state mode without regard for performance in the transient mode. Since lead circuit 37 and lag circuit 36 are active during the transient mode, the characteristics of lead circuit 37 are designed to provide a near deadbeat response in conjunction with lag circuit 36. Thus, lead circuit 37 is designed to compensate for the system poles, zeros, and gain in order to obtain such near deadbeat response.

As shown in FIG. 4, the bandwidth of LPF 34 is low (e.g., 10 Hertz) when the phase error is below a predetermined phase error (i.e., the PLL is locked) and has a high bandwidth (e.g., at least 10 kHz) when the phase error is greater than the predetermined phase error (i.e., a PLL is unlocked).

FIG. 5 shows the embodiment of FIG. 3 in greater detail. First driver 31 is comprised of an n-channel MOSFET 40 and a p-channel MOSFET 41 connected in series between a supply voltage $V_{DD}$ and ground. The gate of MOSFET 40 receives the lag signal and the gate of MOSFET 41 receives the lead signal. The junction of MOSFETs 40 and 41 is connected to a resistor 42 in lag circuit 36. The other side of resistor 42 is connected to the inverting input of op amp 35. Lag circuit 36 also includes a resistor 43 connected in series with a capacitor 44 between the inverting input and the output of op amp 35. Steady-state mode response of the PLL is thus determined by resistors 42 and 43, capacitor 44 and op amp 35. Lag circuit 36 is charged via MOSFET 40 during a lag signal and is discharged via MOSFET 41 during a lead signal. The filter poles for lag circuit 36 provide an upper cutoff frequency of about 10 Hertz to optimize performance during steady-state mode.

Transient detector 33 includes AND gate 45 having one input connected to receive the lead signal from phase comparator 30. The other input of AND gate 45 receives the lead signal through a delay circuit 46. Delay circuit 46 introduces a fixed delay time $t_d$ for transmitting the lead signal and may be comprised of a plurality of series connected buffer amplifiers or an RC timing circuit, for example. Likewise, an AND gate 47 receives the lag signal at one input and receives a delayed lag signal via a delay circuit 48 at its other input.

The duration of fixed delay time $t_d$ depends on the desired response in any particular application. In general, the duration is equal to between about 12.5% and 25% of the period of the reference frequency. For example, a PLL frequency synthesizer in an FM tuner typically uses a reference frequency of 200 kHz which corresponds to the FM channel spacing. The period of this signal is 5 microseconds. Thus, delay time $t_d$ has a duration in the range of 1.2 to 0.6 microseconds.

Second driver 32 includes an n-channel MOSFET 50 connected in series with a p-channel MOSFET 51 between supply voltage $V_{DD}$ and ground. The output of AND gate 45 is connected to the gate input of MOSFET 50 and the output of AND gate 47 is connected to the gate input of MOSFET 51.

Lead circuit 37 includes a resistor 52 having one end connected to the junction between MOSFETs 50 and 51 and its other end connected to a capacitor 53. The other end of capacitor 53 is connected to the noninverting input of op amp 35. A resistor 54 is connected in parallel with capacitor 53. A resistor 55 is connected between the noninverting input of op amp 35 and ground.

The operation of transient detector 33 and second driver 32 will be described with reference to the timing diagrams of FIG. 6. FIG. 6A shows the lag signal having a voltage at point $v_1$. When phase comparator 30 detects a lagging phase difference, the $v_1$ signal transitions from a low logic level to a high logic level as shown at 60. After a duration proportional to the lagging phase difference, signal $v_1$ transitions back to a low level at 61. A signal at point $v_2$ is produced by delay circuit 48 and is shown in FIG. 6B. During the time that both signals $v_1$ and $v_2$ are at a high logic level, the output of AND gate 47 is also at a high logic level and MOSFET 51 is rendered conductive. A signal $v_3$ at the junction of MOSFETs 50 and 51 is thus driven to ground potential as shown at 62 in FIG. 6C. Lead circuit 37 is thus discharged during the transient mode at the same time that lag circuit 36 is charged through MOSFET 40.

FIG. 6A shows another lag signal of relatively shorter duration at 63. However, since the lag signal at 63 (FIG. 6A) is still of a duration longer than the delay time $t_d$, the time delayed signal $v_2$ at 64 (FIG. 6B) is still overlapping and signal $v_3$ is driven to ground at 65 (FIG. 6C). A further lag signal 66 in FIG. 6A has a duration less than the delay time $t_d$. Thus, a time delayed signal $v_2$ at 67 in FIG. 6B does not overlap in time and no corresponding output is provided by second driver 32 (i.e., no change in FIG. 6C). Thus, the phase-locked loop remains in the steady-state mode and only the lag circuit is charged/discharged.

Similarly, the lead signal from phase comparator 30 provides a voltage signal $v_4$ as shown in FIG. 6D. When a high logic level signal at $v_4$ has a duration greater than time delay $t_d$ (as shown at 70 in FIG. 6D), the time delayed output Signal at point $v_5$ from delay circuit 46 (shown in FIG. 6E at 71) overlaps. During the overlapping portion, MOSFET 50 is rendered conductive and voltage signal $v_3$ is driven to the supply voltage $V_{DD}$ as shown at 72 in FIG. 6C, thereby charging lead circuit 37 during the transient mode at the same time that lag circuit 36 is discharged via MOSFET 41.

During the transient mode, both lead circuit 37 and lag circuit 36 are active. Resistors 52, 54 and 55 and capacitor 53 in lead circuit 37 are selected to provide (in conjunction with previously selected resistors 42 and 43 and capacitor 44) filter poles, zeros and gain which provide a near deadbeat response.

FIG. 7 shows the transfer functions which model the phase-locked loop of the present invention. The reference signal R(z) is coupled to one input of a summer 75. The output of the summer is connected to a block 76 having a transfer function D(z) modeling the phase comparator. The output of block 76 is connected to the input of a block 77 having a transfer function H(0) known as a zero-order hold for modeling the driver circuits. During a steady-state mode, a pair of ganged switches 78 and 79 select a block 80 having a transfer function $G_1(s)$ which models the lowpass filter with only the lag circuit being active. During the transient mode, gang switches 78 and 79 select a block 81 having a transfer function $G_2(G_1(s))$ for modeling the lowpass filter when both the lag circuit and the lead circuit are active. The output of switch 79 is connected to the input of a block 82 having a transfer function $G_0(s)$ for modeling the voltage-controlled oscillator. The output of block 82 is connected through a sampling switch 83 (having a sample rate equal to 1/N) to a block 84 having a transfer function H(z). Together, switch 83 and block 84 model the divider. The output of block 84 is connected to the second input of summer 75.

As is apparent from FIG. 7, the characteristics of the phase-locked loop of the present invention can be arbitrarily determined at steady-state operation. The operating characteristics during the transient mode can then be separately designed in a manner which compensates separately for the systems poles, zeros and gain to reach a near deadbeat response.

What is claimed is:

1. A phase-locked loop for generating an output signal having a selectable frequency, comprising:

reference means for generating a reference signal;

phase comparator means responsive to said output signal and said reference signal for generating a lead signal and a lag signal;

a lowpass filter including a lag circuit for providing a relatively low cutoff frequency and a lead circuit for providing a relatively high cutoff frequency;

a voltage-controlled oscillator coupled to the output of said lowpass filter, the output of said voltage-controlled oscillator providing said phase-locked loop output signal;

transient means for comparing a phase error detected by said phase comparator to a predetermined phase error; and driver means coupled to said phase comparator means, said transient means, and said lowpass filter for charging said lag circuit in response to said lag signal and for discharging said lag circuit in response to said lead signal, and if a transient condition is sensed by said transient means then for charging said lead circuit in response to said lead signal and for discharging said lead circuit in response to said lag signal.

2. The phase-locked loop of claim 1 wherein said lead circuit has an impedance which compensates for poles, zeros, and gain of said phase-locked loop to obtain a near deadbeat response.

3. The phase-locked loop of claim 1 wherein said transient means compares the duration of each lag signal and each lead signal with a predetermined duration.

4. The phase-locked loop of claim 3 wherein said predetermined duration is less than about 25% of the period of said reference signal.

5. The phase-locked loop of claim 1 wherein said lowpass filter further includes an amplifier having an inverting input and a noninverting input, and wherein said lag circuit is coupled to said inverting input and said lead circuit is coupled to said noninverting input.

6. The phase-locked loop of claim 1 wherein said lag circuit acting alone provides a cutoff frequency of about 10 Hz, and wherein said lag circuit and said lead circuit acting together provide a cutoff frequency of about 10 kHz or more.

* * * * *